United States Patent [19]

Sigmon et al.

[11] Patent Number: 4,571,555
[45] Date of Patent: Feb. 18, 1986

[54] RE-ENTRANT COAXIAL CAVITY POWER COMBINER

[75] Inventors: Bernard E. Sigmon; Charles V. Evans, both of Tempe, Ariz.

[73] Assignee: Motorola, Inc., Schaumburg, Ill.

[21] Appl. No.: 595,019

[22] Filed: Mar. 30, 1984

[51] Int. Cl.⁴ .............................................. H03B 7/14
[52] U.S. Cl. ..................................... 331/56; 330/287; 330/56; 331/107 P; 331/107 C; 333/250
[58] Field of Search ............... 331/56, 107 P, 96, 101, 331/102, 107 DP, 107 C, 117 D; 330/286, 287, 53, 56; 333/250

[56] References Cited

U.S. PATENT DOCUMENTS 2,242,404  5/1941  Schüssler ........................... 333/226
4,471,325  9/1984  Wagner ............................... 331/56

OTHER PUBLICATIONS

Barth et al., "Design and Performance of 90 GHz Radiometer Front Ends", Conference Proceedings No. 245, Millimeter and Submillimeter Wave Propagation and Circuits, Munich Germany, 4-8, Sep. 1978, pp. 1-5.

Primary Examiner—Siegfried H. Grimmm
Attorney, Agent, or Firm—Raymond J. Warren

[57] ABSTRACT

A plurality of negative resistance devices is spaced below a cylindrical center conductor of a single coaxial cavity. Each negative resistance device has a bias device connected to it by a bias wire. Extending radially through the outer wall of the coaxial cavity is a coax cable with an RF coupling probe. A tuning screw is place axially through the interior of the center conductor for tuning the frequency of the power combiner.

15 Claims, 6 Drawing Figures

— PRIOR ART —

– PRIOR ART –

– PRIOR ART –

– PRIOR ART –

RE-ENTRANT COAXIAL CAVITY POWER COMBINER

BACKGROUND OF THE INVENTION

1. Field of the Invention

This invention relates, in general, to a power combiner utilizing a plurality of oscillators and, more particularly, to a power combiner which utilizes a single coaxial cavity having a plurality of active devices.

2. Description of the Background

Power combiners of the type utilizing a plurality of solid state power sources, such as diodes, are known in the art. These types of power combiners utilize a plurality of cavities, one for each diode (e.g. U.S. Pat. Nos. 4,097,817; 3,962,654 and 3,378,789). One example of a power combiner utilizing a plurality of solid state sources and having a plurality of cavities is U.S. Pat. No. 4,188,590, entitled "Conical Power Combiner" issued Feb. 12, 1980. This invention, while utilizing a plurality of solid state sources, has each source coupled to a common output line through a waveguide. This requires that the body of the combiner be a size large enough to accommodate each of the oscillators and their respective waveguides.

SUMMARY OF THE INVENTION

Accordingly, it is an object of the present invention to provide a method and apparatus that will operate with a plurality of solid state devices utilizing a single cavity.

A further object of the present invention is to provide a method and apparatus that approaches 100% combining efficiency.

Yet another object of the present invention is to provide a method and apparatus that will be simpler and easier to manufacture making it more economical.

The above and other objects and advantages of the present invention are provided by an apparatus and method of combining a plurality of solid state devices in a single cavity.

A particular embodiment of the present invention comprises an apparatus and method of circumferentially spacing a plurality of negative resistance devices below an elongated cylindrical center conductor of coaxial cavity. Each negative resistance device has a biased device connected to it by a bias wire. Extending radially through the outer wall of the coaxial cavity is a coax cable with an RF coupling probe. A tuning screw is placed axially through the interior of the elongated cylindrical center conductor of the coaxial cavity.

BRIEF DISCUSSION OF THE DRAWINGS

DETAILED DESCRIPTION OF THE INVENTION

Figure 1:
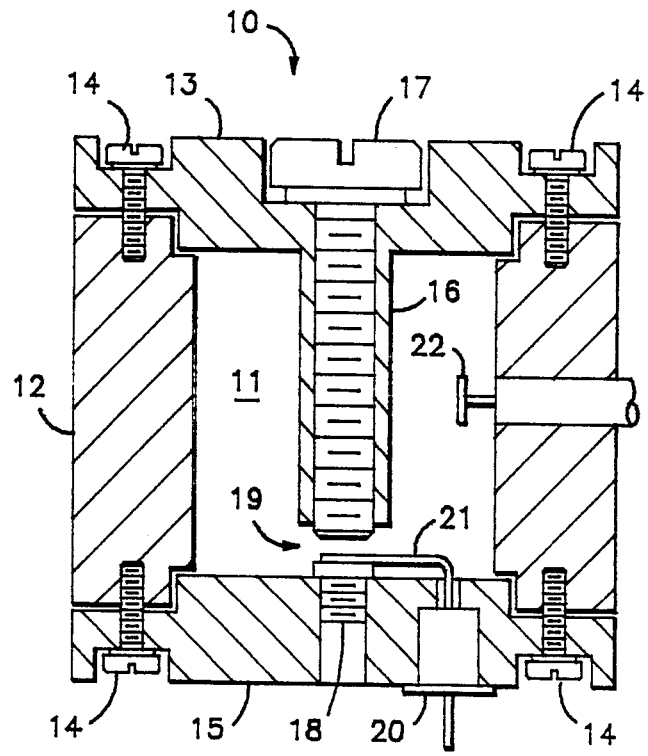
FIG. 1 is a cross-section of a prior art oscillator, having a single negative resistance device.

Referring to the diagram of FIG. 1 a cross-sectional view of a prior art oscillator, generally designated 10, having a single negative resistance device is illustrated. Oscillator 10 is shown with a single cylindrical coaxial tuned cavity 11 formed by exterior wall 12; an upper cap 13 being coupled to exterior wall 12 by fasteners (i.e. screws) 14; and a lower cap 15 coupled to exterior wall 12 by fasteners 14. A cantilevered center conductor 16 is attached to upper cap 13 and extends axially downward into cavity 11. Placed axially through upper cap 13 and into center conductor 16 is a tuning screw 17 which is threadedly attached to upper cap 13. A negative resistance device (i.e. Gunn, IMPATT, Baritt and Tunnel Diodes, and Bipolar and Field Effect Transistors) is threadedly attached to lower cap 15 and extends axially into cavity 11 leaving a cap 15 and extends axially into cavity 11 leaving a gap 19 between the base of center conductor 16 and the head of device 18. Also attached to lower cap 15 is a bias feedthrough 20 a portion of which extends into cavity 11. Bias feed through 20 is coupled to device 18 by a bias wire 21. Radially coupled through exterior wall 12 is an RF coupling probe 22 for removing the power generated in oscillator 10. A modulator (not shown) is coupled to bias feed through 20 by a driving transistor (not shown). Here device 18 forms one element in a series resonant circuit. Center conductor 16, which is an inductor, and gap 19 form an LC network which determines the frequency of oscillation. This will be shown in more detail below.

Figure 2:
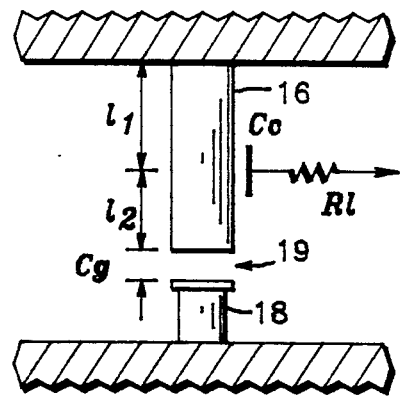
FIG. 2 is a partially exploded view of FIG. 1 indicating various electrical parameters.
Figure 3:
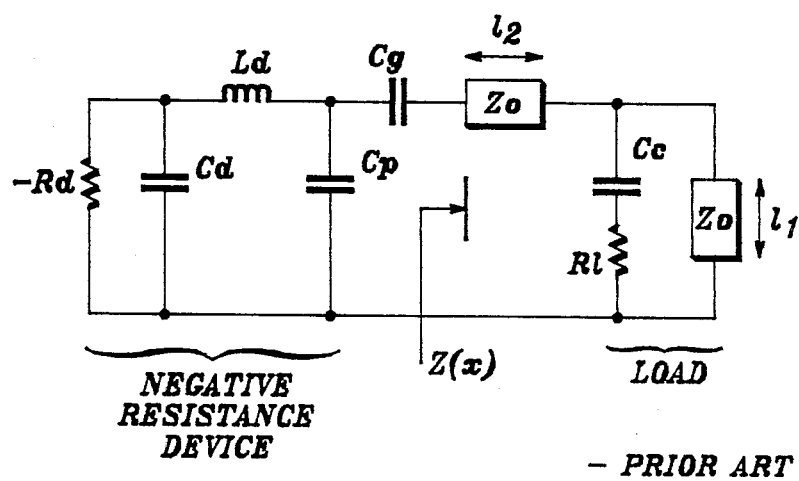
FIG. 3 is a schematic diagram of FIG. 1.
Figure 4:
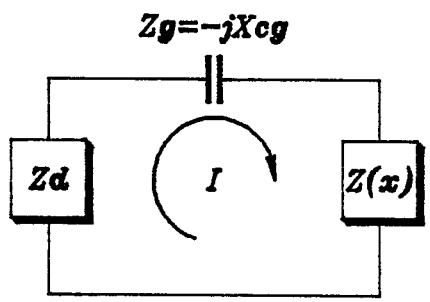
FIG. 4 is an equivalent schematic diagram of FIG. 3.

Referring now to FIG. 2 a partially exploded view of FIG. 1 is illustrated showing center conductor 16, device 18, and several of the electrical parameters within oscillator 10. FIG. 3 illustrates a schematic diagram of oscillator 10. In FIG. 3 $-R_D$, $C_D$ and $L_D$ represent the resistance, capacitance and inductance, respectively, of negative resistance device 18; $C_P$ represents the capacitance created between upper cap 13 and lower cap 15; $C_g$ represents the capacitance of gap 19; $Z_0$ ($l_2$) and $Z_0$ ($l_1$) represent the impedance of length $L_2$ and $L_1$, respectively, of center conductor 16; $C_C$ represents the capacitance formed between center conductor 16 and RF coupling probe 22; and $R_1$ represents the resistance of coupling probe 22. $Z(x)$ represents the impedance looking from gap 19 to center conductor 16. In FIG. 4 an equivalent schematic diagram of FIG. 3 is illustrated. In FIG. 4 $Z_D$ represents the equivalent impedance of device 18. $Z_g$ represents the impedance of gap 19; $Z(x)$ represents the impedance described above in FIG. 3; and I represents the current flowing through the circuit of FIG. 4. The circuit will be considered in resonance when:

$$Z_D + Z_g + Z(x) = 0 \tag{1}$$

Figure 5:
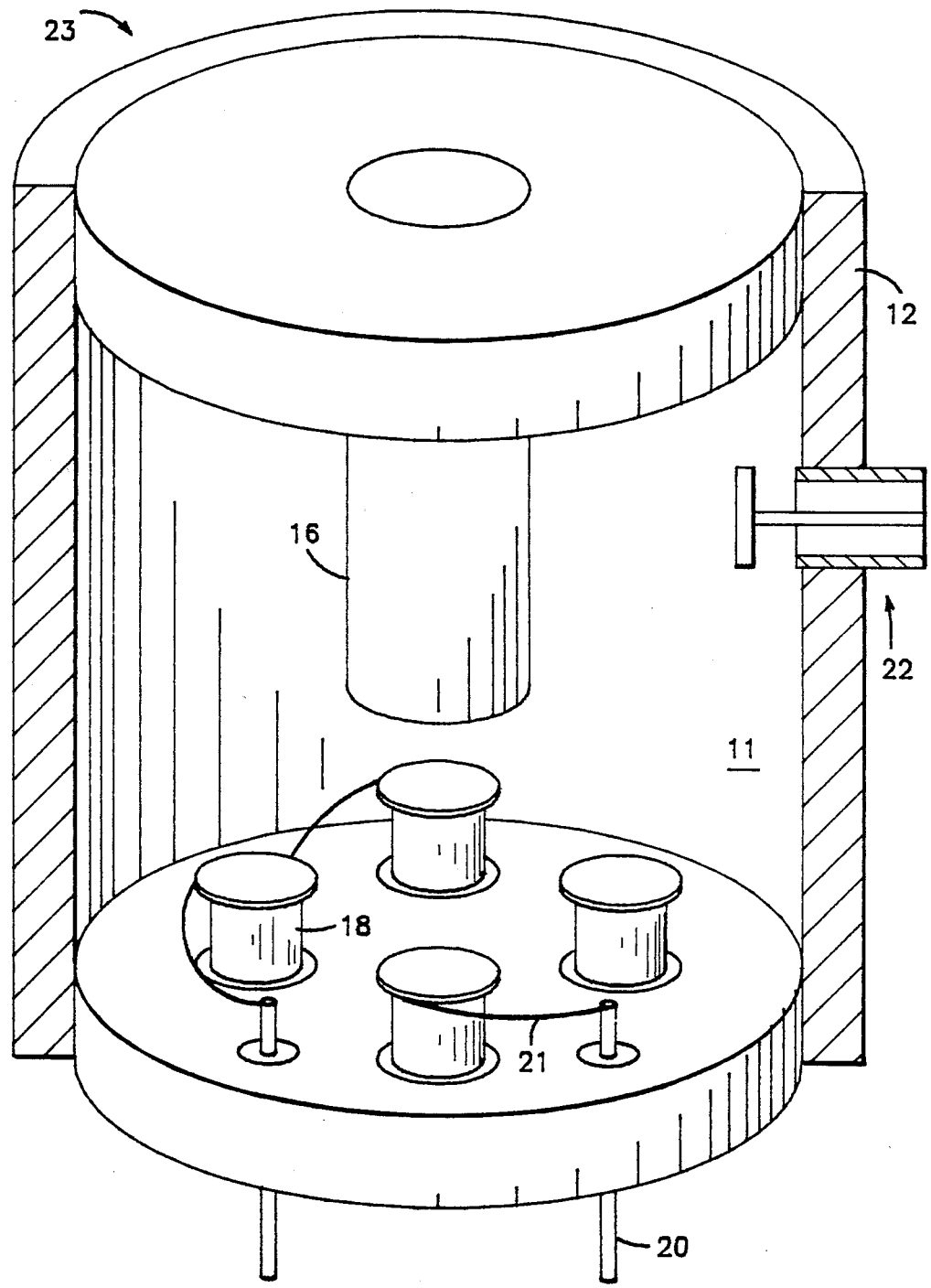
FIG. 5 is an exploded view, with portions being broken away, of a device embodying the present invention and utilizing four negative resistance devices.

Referring now to FIG. 5 an exploded view, with portions broken away, of a power combiner, generally designated 23, utilizing a plurality of devices 18 is illustrated. FIG. 5 illustrates a cantilevered center conductor 16 positioned above a circularly spaced plurality of negative resistance devices 18. Each device 18 has associated with it a bias feedthrough 20 being coupled to device 18 by bias wire 21. A pulse modulator (not shown) is connected to each bias feed thru 20 through a transistor (not shown). Devices 18 may be powered through a common lead from the pulse modulator using one driver. However, if the one driver is interrupted the entire system stops functioning. This is prevented by connecting separate drivers to each bias 20 insuring that if one driver goes out the remainder will continue to operate. Having separate drivers also increases the efficiency of power combiner 23. The pulse modulator is used to supply a DC or pulse voltage to power combiner 23, this will also operate using continuous wave (CW) power. The DC power supplied to power combiner 23 causes devices 18 to oscillate. When more than one device is used an injection locking phenomenon occurs causing all of devices 18 to oscillate at the same frequency. The distance between the head of devices 18 and center conductor 16 determines the frequency at which devices 18 will operate. A tuner, see FIG. 1, may be added to fine tune the frequency. A tuner is generally limited in the amount of tuning it may perform (30-40%) so that the basic frequency is set by gap 19, see FIG. 1. By way of example, coupling a pulse modulator to a device utilizing a single active device, FIG. 1, would create an RF power output of 12 watts. By adding additional active devices, FIG. 5, an RF power output of approximately 48 watts is created thus, having a 100% combining efficiency. This process has been successfully tested using five active devices.

By having a power combiner that operates with a plurality of active elements in a single cavity a simpler and more economical device is created. By having one cavity there are fewer parts and less overall material needed to accommodate the same number of oscillators as in the prior art. This creates a savings in cost of production and reduced size of the final device.

Figure 6:
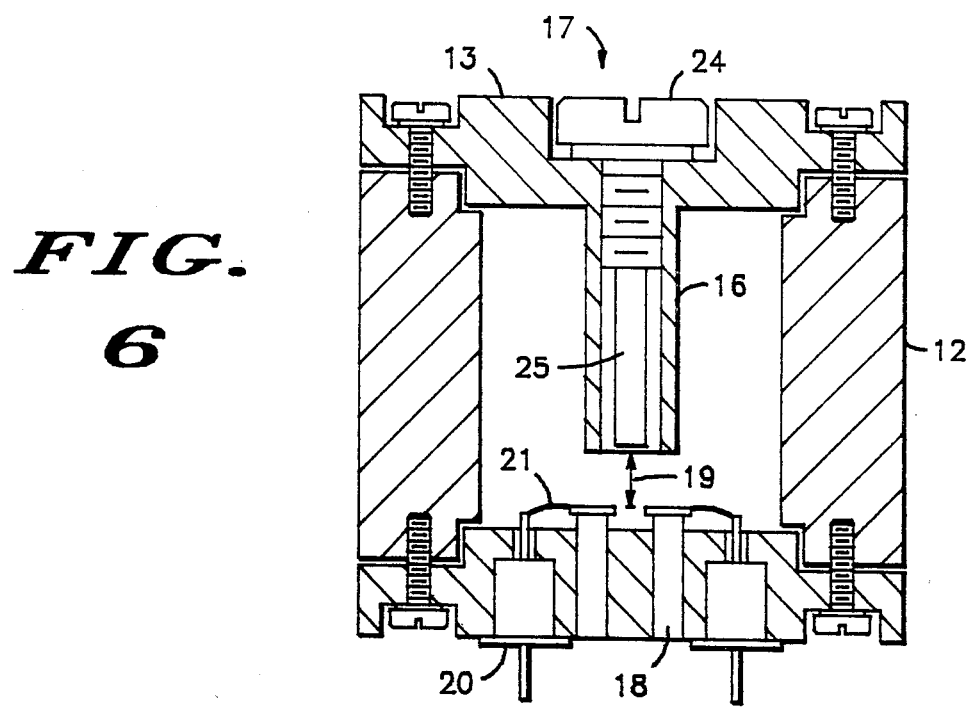
FIG. 6 is an exploded view, with portions being broken away, of a device embodying the present invention illustrating the tuning device.

Referring now to FIG. 6, an exploded view, with a portion broken away illustrating tuning screw 17 is shown. Tuning screw 17 is illustrated here as having an upper portion 24 and a lower portion 25. Upper portion 24 is comprised of metal and has a threaded head for threadedly inserting and adjusting tuning screw 17. Lower portion 25 is a dielectric, such as sapphire, and is used to tune the power combiner. As the distance between portion 25 and devices 18 is increased (decreased) the frequency at which devices 18 operate increases (decreases).

Because of the heat the power combiner may be subjected to in different environments the material that comprise the power combiner will expand. The expansion can cause variations in the frequency as gap 19 varies. To compensate for this expansion different compounds must be selected having different coefficients of linear expansion (k) such that the frequency will remain relatively constant. One such combination of metals consist of making upper cap 13 and center conductor 16 of brass, which has a coefficient of approximately 19 PPM/°C., and an exterior wall of aluminum, which has a coefficient of approximately 27 PPM/°C. Lower cap 15 may be made of any variety of metals as its expansion does not effect the frequency With the above described elements, as the power combiner heats up, the aluminum portion, 12, will expand increasing gap 19. Increasing gap 19 causes the capacitance to decrease and the frequency to increase. At the same time the brass portions, 13 and 16, will increase causing gap 19 to decrease resulting in a decrease in the frequency. This decrease in gap 19 is required to be less than the corresponding increase since, as the aluminum increases so does the volume of the cavity which causes a reduction in the frequency. Therefore, the expansion of gap 19 is offset by a corresponding decrease in gap 19 combined with an increase in the cavity of the oscillator. This results in a constant frequency.

Thus, it is apparent that there has been provided, in accordance with the invention, a device and method that fully satisfies the objects, aims and advantages set forth above.

It has been shown that the present invention provides a power combiner that will operate with a plurality of solid state devices in a single cavity, resulting in a smaller, simpler and more economical apparatus.

While the invention has been described in conjunction with specific embodiments thereof, it is evident that many alternatives, modifications and variations will be apparent to those skilled in the art in light of the foregoing description. Accordingly, it is intended to embrace all such alternatives, modifications, and variations as fall within the spirit and broad scope of the appended claims.

We claim:
1. Power combining apparatus comprising:
  housing means forming a cylindrical coaxial tuned cavity therein;
  a cantilevered center conductor cylinder coupled to said housing means extending axially into the cavity of said housing means; and
  a plurality of negative resistance devices extending axially into the cylindrical coaxial tuned cavity of said housing means opposite said center conductor cylinder.

2. The power combining apparatus of claim 1 wherein said housing means comprises:
  an exterior wall defining an opening extending therethrough, said exterior wall having a first end and a second end opposite said first end;
  a first end cap being coupled to said first end of said exterior wall, said first end cap being coupled to said center conductor cylinder; and
  a second end cap being coupled to said second end of said exterior wall, said second end cap being coupled to said plurality of negative resistance devices.

3. The power combining apparatus of claim 2 which further comprises:
  a plurality of bias means for biasing said negative resistance devices, said plurality of bias means being disposed through said second cap and extending axially into the cylindrical coaxial tuned cavity of said housing, said plurality of bias means being coupled one each to said plurality of negative resistance devices;
  tuning means for tuning the frequency of said power combining apparatus, said tuning means being adjustably coupled to said first cap and extending axially into the cylindrical coaxial tuned cavity of said housing means; and
  RF coupling means for removing a combined power from said power combining apparatus, said RF coupling means being coupled to said housing and extending into the cylindrical coaxial tuned cavity of said housing.

4. The power combining apparatus of claim 3 wherein said tuning means comprises an elongated cylindrical rod extending axially through said center conductor cylinder.

5. The power combining apparatus of claim 4 wherein said tuning means is comprised of a dielectric substance.

6. The power combining apparatus of claim 5 wherein said tuning means is comprised of sapphire.

7. The power combining apparatus of claim 6 wherein said plurality of negative resistance devices comprises a plurality of one of GUNN, IMPATT, Baritt, and Indium Phosphide diodes.

8. The power combining apparatus of claim 6 wherein said plurality of negative resistance devices comprises an active element capable of oscillating.

9. A method of combining power from a plurality of negative resistance devices which comprises:
providing a housing having a single cylindrical coaxial tuned cavity, said housing having a cylindrical center conductor extending into the single cylindrical coaxial tuned cavity;
providing said plurality of negative resistance devices extending axially into the single cylindrical coaxial tuned cavity of said housing opposite said cylindrical center conductor;
spacing said plurality of negative resistance devices circumferentially below said center conductor cylinder;
spacing said plurality of negative resistance devices from said cylindrical center conductor defining a gap; and causing the apparatus to oscillate at a frequency corresponding to the gap defined by said plurality of negative resistance devices and said cylindrical center conductor.

10. Power combining apparatus comprising:
a housing forming a cylindrical coaxial tuned cavity therein, said housing having an exterior wall, a first cap and a second cap;
a cantilevered cylindrical center conductor being coupled to said first cap and extending axially into the cavity of said housing;
a plurality of negative resistance means being secured to said second cap and extending axially into the cylindrical coaxial tuned cavity of said housing;
a plurality of bias means being secured to said second cap and extending into the cylindrical coaxial tuned cavity of said housing, said plurality of bias means being coupled one each to said negative resistance means;
a tuning means for tuning the frequency of said power combining apparatus, said tuning means being adjustably attached to said first cap of said housing and extending axially through said cylindrical center conductor; and
an RF coupling means for removing the power from said power combining apparatus, said RF coupling means being coupled to said housing and extending into the cylindrical coaxial tuned cavity of said housing.

11. The power combining apparatus of claim 10 wherein said tuning means comprises an elongated cylindrical rod extending axially through said cylindrical center conductor.

12. The power combining apparatus of claim 11 wherein said tuning means is comprised of a dielectric substance.

13. The power combining apparatus of claim 12 wherein said tuning means comprises sapphire.

14. The power combining apparatus of claim 13 wherein said plurality of negative resistance means comprises a plurality of one of Gunn, IMPATT, and Indium Phosphide diodes.

15. The power combining apparatus of claim 13 wherein said plurality of negative resistance devices comprises an active element capable of oscillating.

* * * * *